(12) United States Patent
Tanaka et al.

(10) Patent No.: US 7,829,784 B2
(45) Date of Patent: Nov. 9, 2010

(54) SOLAR BATTERY AND FABRICATION METHOD THEREOF

(75) Inventors: Satoshi Tanaka, Yamatotakada (JP); Masaomi Hioki, Gose (JP); Keisuke Ohhira, Katsuragi (JP); Tomohiro Machida, Yao (JP); Yoshikazu Kawagoe, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 1053 days.

(21) Appl. No.: 11/003,341

(22) Filed: Dec. 6, 2004

(65) Prior Publication Data

US 2005/0126626 A1    Jun. 16, 2005

(30) Foreign Application Priority Data

Dec. 16, 2003 (JP) .............................. 2003-418105

(51) Int. Cl.
*H01L 31/00* (2006.01)
(52) U.S. Cl. .................................................... 136/252
(58) Field of Classification Search .......... 136/243–265
See application file for complete search history.

(56) References Cited

U.S. PATENT DOCUMENTS

| 4,451,969 | A | * | 6/1984 | Chaudhuri | .................... 438/62 |
| 6,294,722 | B1 | * | 9/2001 | Kondo et al. | ................. 136/244 |
| 2002/0055046 | A1 | * | 5/2002 | Ono et al. | .................... 429/324 |
| 2002/0071401 | A1 | | 6/2002 | Nire | |
| 2002/0126696 | A1 | | 9/2002 | Toguchi et al. | |
| 2004/0003836 | A1 | | 1/2004 | Watsuji et al. | |

FOREIGN PATENT DOCUMENTS

| JP | 11-75131 A | 3/1999 |
| JP | 11-98156 A | 4/1999 |
| JP | 2000-90734 | 3/2000 |
| JP | 2000-332274 | 11/2000 |
| JP | 2001-339078 A | 12/2001 |
| JP | 2002-94529 A | 3/2002 |
| JP | 2002-217435 A | 8/2002 |
| JP | 2003-223813 A | 8/2003 |

OTHER PUBLICATIONS

N. Enebish, The national photovoltaic program 100,000 solar house (GER) in Mongolia, 2000, IEEE, 1748-1751.*
C. Harris, Mongolia, the land the climate, 2008, Britanica Online Encyclopedia.*
K. Shimada, Manufacture of Solar Battery Cell, Nov. 30, 2000, JPO, translated Mar. 24, 2008.*

\* cited by examiner

*Primary Examiner*—Alexa D Neckel
*Assistant Examiner*—Miriam Berdichevsky
(74) *Attorney, Agent, or Firm*—Nixon & Vanderhye P.C.

(57) ABSTRACT

A fabrication method of a solar battery includes at least an aluminum electrode formation step of applying, drying and baking aluminum paste on at least a portion of the back side of a solar cell to form an aluminum electrode, and a cooling step of cooling the solar cell having an aluminum electrode formed at an atmosphere temperature of not more than 10° C., after the aluminum electrode formation step. Accordingly, a solar battery having warping reduced without degrading the electric characteristics, reliability and appearance, and a fabrication method thereof are provided.

2 Claims, 3 Drawing Sheets

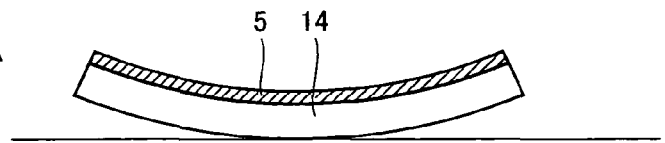
FIG.4A
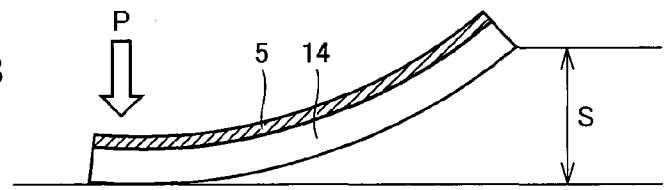
FIG.4B
FIG.5
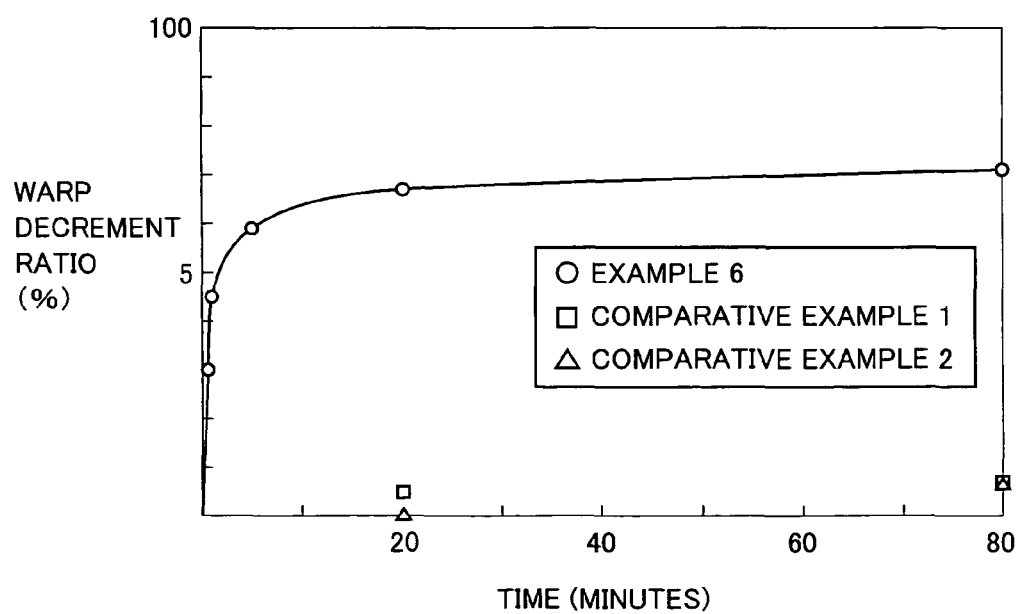

SOLAR BATTERY AND FABRICATION METHOD THEREOF

This nonprovisional application is based on Japanese Patent Application No. 2003-418105 filed with the Japan Patent Office on Dec. 16, 2003, the entire contents of which are hereby incorporated by reference.

BACKGROUND

1. Field of the Technology

The present technology relates to a solar battery and a fabrication method thereof, particularly to a solar battery having an aluminum electrode formed on at least a portion of the back side of a solar cell, and a method of fabricating such a solar battery.

2. Description of the Background Art

An aluminum electrode and the like are formed at a major area of the back side of a solar cell, identified as the back electrode of a solar battery. Formation of such an aluminum electrode is effected by applying, drying, and then baking aluminum paste on at least a portion of the back side of the solar cell. In the baking process of aluminum paste to form an aluminum electrode, the surface of the aluminum electrode was warped in a concave manner by shrinkage caused by the baking of aluminum paste, which was attributed to the cracking and defect of the solar battery in the subsequent processing step thereof.

There is an approach to reduce this warping of a solar battery by reducing the applied amount of aluminum paste (refer to Japanese Patent Laying-Open No. 2000-090734). However, this approach had the disadvantage that sufficient electrical characteristics cannot be achieved by the reduction of the BSF (Back Surface Field) effect corresponding to the smaller amount of aluminum paste applied. Although the aforementioned publication discloses evaluation of the composition of the aluminum paste itself to suppress reduction in the BSF effect, it is difficult to avoid reduction in the BSF effect. There are also the problems of a rise in cost due to the added agent, deterioration of the appearance of the baked surface, and the like.

It is desired to reduce warping of a solar battery without degrading the electrical characteristics, reliability, and appearance.

SUMMARY

In view of the foregoing, a feature of an example embodiment presented herein is to provide a solar battery having warping reduced without degrading the electrical characteristics, reliability and appearance, and a method of fabricating such a solar battery.

According to an aspect of the example embodiment, a fabrication method of a solar battery includes at least an aluminum electrode formation step of applying, drying and baking aluminum paste on at least a portion of the back side of a solar cell to form an aluminum electrode, and a cooling step of cooling the solar cell having an aluminum electrode formed at an atmosphere temperature of not more than 10° C., after the aluminum electrode formation step.

The fabrication method of a solar battery of the example embodiment preferably includes the step of placing the solar cell having the aluminum electrode formed in an atmosphere of at least 20° C. after the cooling step. The cooling step can be conducted in a dry atmosphere. In the cooling step, the duration of cooling the solar cell having an aluminum electrode formed is preferably at least 5 seconds. Furthermore, the cooling step is preferably carried out immediately after the aluminum electrode formation step.

According to another aspect of the example embodiment, a solar battery includes a solar cell having a thickness of not more than 300 µm, and an aluminum baking layer of an aluminum electrode having a thickness of at least 30 µm. The solar cell warping ratio that is the percentage of warping of the solar cell with respect to the length of one edge of the solar cell is not more than 2.5%.

According to the example embodiment, a solar battery having warping reduced without degrading the electric characteristics, reliability and appearance, and a fabrication method thereof can be provided.

The foregoing and other features, aspects and advantages of the example embodiment presented herein will become more apparent from the following detailed description of the present invention when taken in conjunction with the accompanying dryings.

BRIEF DESCRIPTION OF THE DRAWINGS

FIGS. 4A and 4B are schematic diagrams to describe a method of measuring the degree of warping of a solar cell.

FIG. 5 represents the change in the solar cell warping ratio.

DESCRIPTION OF THE PREFERRED EMBODIMENTS

Figure 1:
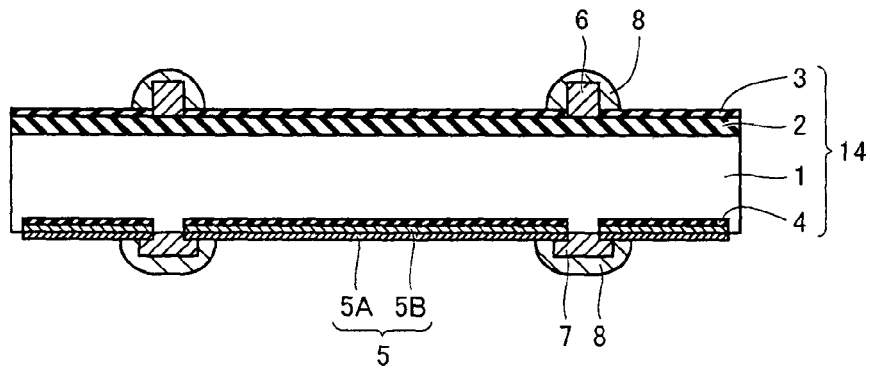
FIG. 1 is a schematic sectional view of a solar battery of an example embodiment.

Referring to FIG. 1, a method of fabricating a solar battery of an example embodiment includes at least an aluminum electrode formation step and a cooling step. The aluminum electrode formation step is carried out by applying, drying and baking aluminum paste on at least a portion of the back side of a solar cell 14 to form an aluminum electrode 5. The cooling step is carried out by cooling solar cell 14 with aluminum electrode 5 at an atmosphere temperature of not more than 10° C., after the aluminum electrode formation step. Warping of the solar cell can be reduced by such a cooling step. As used herein, the back side of a solar cell is the side opposite to the light receiving surface of the solar cell.

Figure 2:
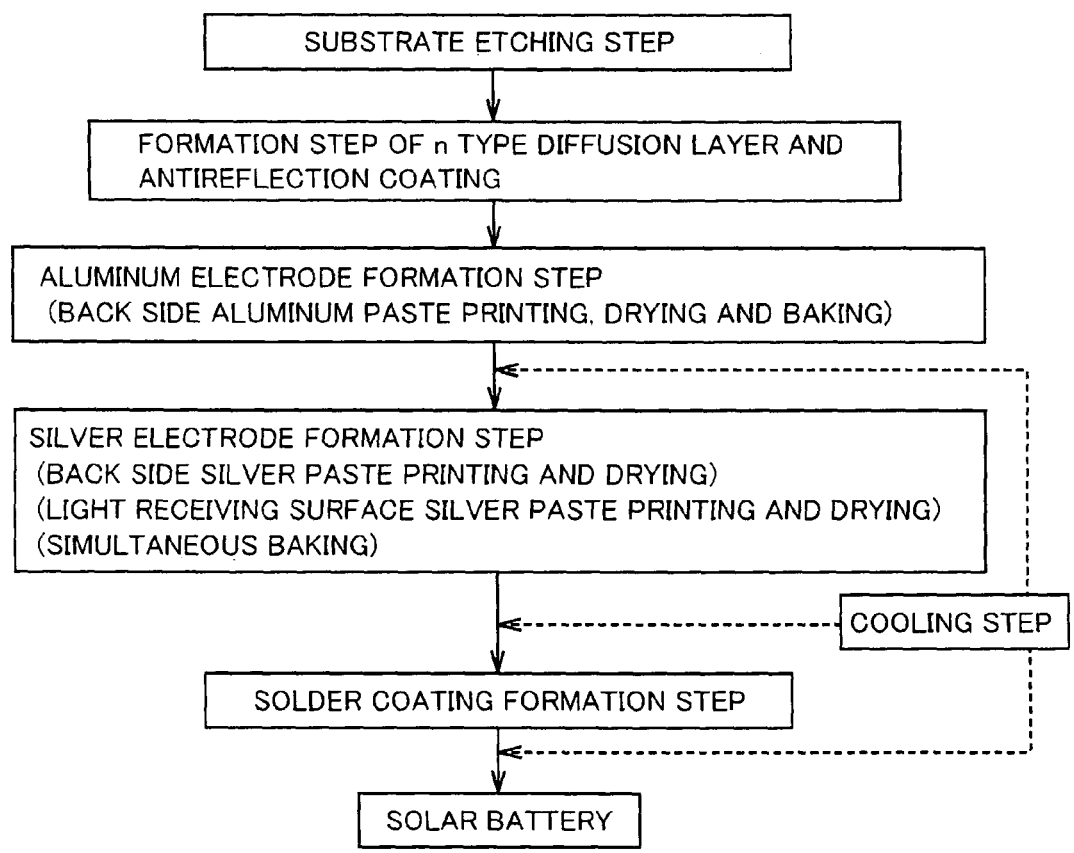
FIG. 2 is a diagram to describe a fabrication method of the solar battery of example embodiment.

A typical fabrication method of a solar battery will be described hereinafter with reference to FIGS. 1 and 2. First, etching is applied on a p type silicon substrate 1. Following this substrate etching step, an n type diffusion layer formation step is conducted. Specifically, an n type diffusion layer 2 is formed at one side of p type silicon substrate 1 subjected to etching, i.e., the side identified as the light receiving surface. Then, an antireflection coating formation step is conducted. Specifically, an antireflection coating 3 to reduce the surface reflectance is formed on n type diffusion layer 2.

Then, aluminum paste is applied on at least a portion, substantially the entire surface in general (excluding the region where a silver electrode is formed at the back side at a subsequent step), at the back side of p type silicon substrate 1. The aluminum paste is dried, and then baked at an oxidizing atmosphere of high temperature to form an aluminum electrode 5. When baking is conducted at a temperature of at least 577° C. that is the eutectic point of aluminum and silicon, there are formed an aluminum baking layer 5A, as well as an aluminum-silicon alloy layer 5B and a p$^+$ silicon layer 4 between aluminum baking layer 5A and p type silicon substrate 1. In this case, aluminum baking layer 5A and aluminum-silicon alloy layer 5B constitute aluminum electrode 5. This corresponds to the aluminum electrode formation step including the step of applying, drying and baking aluminum paste at the back side. From the standpoint of applying thin paste evenly, application of aluminum paste is carried out preferably by, but not particularly limited to, printing aluminum paste by screen printing.

Then, silver paste is applied in the form of a pattern at a portion of the light receiving plane of antireflection coating 3 and a portion of the back side of p type silicon substrate 1. Baking is conducted in an oxidizing atmosphere of high temperature to form silver electrodes 6 and 7. Specifically, this silver electrode formation step can be conducted by forming respective silver electrodes individually and not together, or simultaneously, on the back side and the light receiving surface. In the case of the former, a back side silver paste application-drying step of applying and then drying silver paste at the back side is conducted, followed by baking to form silver electrode 7 at the back side (back side silver electrode formation step). Additionally, a light receiving surface silver paste application-drying step of applying and drying silver paste on the light receiving surface is carried out, followed by baking to form silver electrode 6 (light receiving surface silver electrode formation step). In the case of simultaneous formation, silver paste is applied and dried at both the back side and the light receiving surface, as shown in FIG. 2, followed by baking the silver paste at the same time to form silver electrodes at the light receiving surface and the back side (dual side silver electrode simultaneous formation step).

From the standpoint of applying thin paste evenly, application of aluminum paste is carried out preferably by, but not particularly limited to, printing aluminum paste by screen printing. With regards to the silver paste applied and dried on antireflection coating 3 at the light receiving surface side, the silver paste component passes through antireflection coating 3 to arrive at n type diffusion layer 2 by the baking step. Therefore, silver electrode 6 at the light receiving surface is formed on n type diffusion layer 2, as shown in FIG. 1.

Then, the solar cell having an aluminum electrode and silver electrodes formed is dipped for several ten seconds in flux at ordinary temperature (approximately 25° C.), dried by air, then dipped in a bath of molten solder of approximately 200° C. to apply a coating of a solder layer 8 on silver electrodes 6 and 7. By this solder coating formation step, a solar battery is obtained. In the fabrication method of a solar battery, the solder coating formation step is arbitrary, and may not be conducted.

In the above-described typical fabrication method of a solar battery, the aluminum paste shrinks by the baking process during the aluminum electrode formation step in which the aluminum paste applied at a major area of the backside of the solar cell is baked. The surface of the aluminum electrode will be warped in a concave manner by the shrinking thereof. The solar battery fabrication method of the present invention includes a cooling step of cooling the solar cell at the temperature of 10° C. or below, subsequent to the aluminum electrode formation step, as indicated by the broken arrow in FIG. 2. Accordingly, warping of the solar cell is reduced. Reduction in the warping by the cooling step is due mainly to the reason set forth below.

Figure 3A:
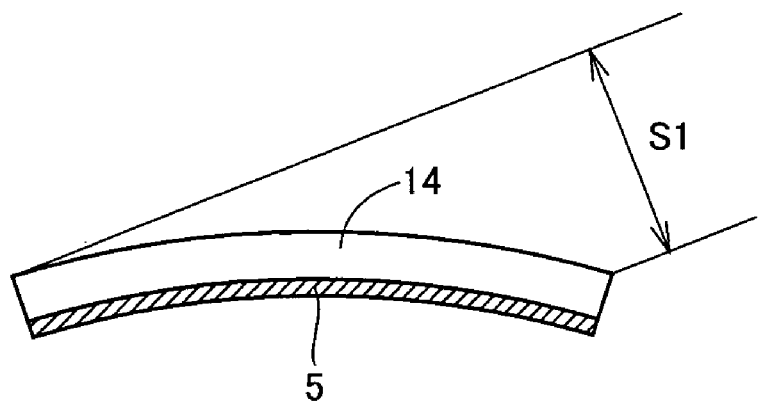
FIG. 3A is a schematic diagram representing the degree of warping of a solar cell immediately after an aluminum electrode formation step.
Figure 3B:
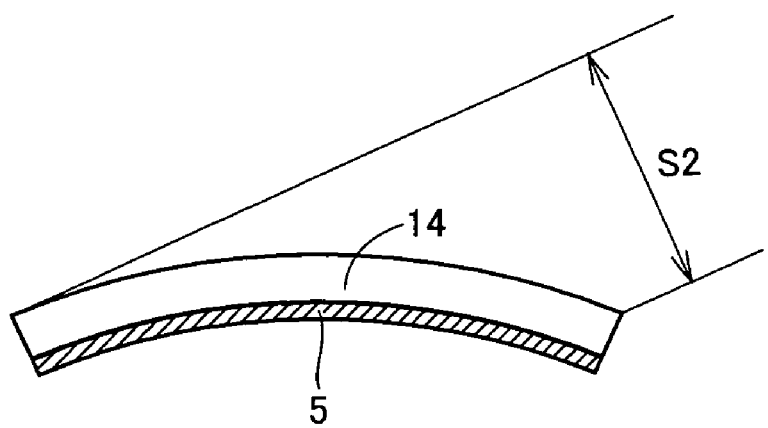
FIG. 3B is a schematic diagram representing the degree of warping of a solar cell immediately after a cooling step.
Figure 3C:
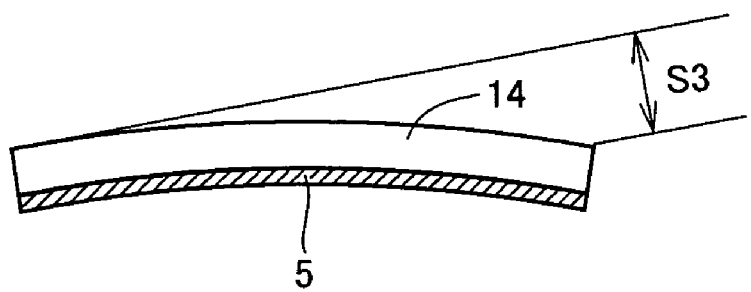
FIG. 3C is a schematic diagram representing the degree of warping of a solar cell left in a chamber.

Referring to FIGS. 3A-3C, the surface of aluminum electrode 5 of solar cell 14 warps in a concave manner by the shrinkage caused by baking aluminum paste in the aluminum electrode formation step, as shown in FIG. 3A. Such warping S1 is defined as the distance from the surface including the tangent at one edge of solar cell 14 to the right end of the opposite edge (right opposite corner). At this stage, the solar cell is bent by the shrinking aluminum electrode, storing restoring force. When the solar cell is cooled, the aluminum electrode shrinks further since the coefficient of linear expansion of aluminum (for example, $18.0 \times 10^{-6 \circ}$ $C.^{-1}$ to $23.8 \times 10^{-6 \circ}$ $C.^{-1}$ at $-50°$ C. to $50°$ C.) forming the aluminum electrode is larger than the coefficient of linear expansion of silicon (for example, $1.0 \times 10^{-6 \circ}$ $C.^{-1}$ to $2.4 \times 10^{-6 \circ}$ $C.^{-1}$ at $-50°$ C. to $50°$ C., for example) forming the solar cell. The degree of warping S2 at this stage is larger than warping S1, so that the solar cell stores a larger restoring force, as shown in FIG. 3B. At the completion of the cooling step, the temperature of the solar cell returns to the temperature prior to the cooling step, so that the aluminum electrode having a coefficient of linear expansion greater than that of silicon expands greater than the solar cell, and the restoring force stored at the solar cell is released. Accordingly, the warping of solar cell 14 is reduced to a degree of warping (S3) as shown in FIG. 3C, which is smaller than the degree of warping S1 of the solar cell prior to the cooling step and after the aluminum electrode formation step. In view of the fact that the solar cell is bent more as the cooling temperature is lower to store a larger restoring force, it is preferable that the cooling temperature be as low as possible. Specifically, the cooling temperature is preferably not more than 0° C., further preferably not more than –17° C.

In the fabrication method of a solar battery of the example embodiment presented herein, the step of placing the solar cell with an aluminum electrode in an atmosphere of at least 20° C. is preferably carried out after the cooling step. Specifically, the solar cell is preferably placed in an atmosphere of at least 20° C., after the cooling step. The expansion of the aluminum electrode and the restoring force of the solar cell become larger as the difference between the cooling temperature in the cooling step and the atmosphere temperature after the cooling step becomes larger to result in smaller warping of the solar cell. In view of the foregoing, the difference between the cooling temperature in the cooling step and the atmosphere temperature after the cooling step is preferably at least 10° C., more preferably at least 20° C., and further preferably at least 37° C.

In the fabrication method of a solar battery of the example embodiment, the cooling step is preferably carried out in a dry atmosphere. This is required to prevent dew condensation of the solar battery. As used herein, a dry atmosphere refers to an atmosphere in which dew concentration of the solar battery does not occur in the cooling step and subsequent step. For example, dry atmosphere refers to a dry air atmosphere (dew point of not more than –40° C.) when the cooling temperature in the cooling step is –17° C.

In the fabrication method of a solar battery according to the example embodiment, the duration of cooling in the cooling step is preferably at least 5 seconds. If the duration is less than 5 seconds, the effect of reducing warping of the solar cell is significantly reduced. In view of the foregoing, the cooling time is preferably at least 25 seconds, further preferably at least one minute, and most preferably at least 5 minutes.

The cooling step in the fabrication method of a solar battery of the example embodiment is not particularly limited, as long as it is conducted after the aluminum electrode formation step. In FIG. 2, the cooling step can be carried out after the aluminum electrode formation step, after the silver electrode formation step, or after the solder coating formation step. However, the cooling step is preferably carried out immediately after the aluminum electrode formation step taking into consideration the fact that the aluminum electrode formation step is the first step by which warping of a solar cell occurs and that a screen printing step of silver paste where warping of the solar electrode substrate should be small follows the aluminum electrode formation step. The cooling step is not limited to once, and can be carried out two times or more, subsequent to the aluminum electrode formation step.

The cooling method in the cooling step of the fabrication method of a solar battery of the example embodiment includes, but not limited to, a non-contact type cooling method using a freezer, a refrigerator, or an air cooler, or a contact type cooling method by contact with a Peltier sheet or dipping in a liquid refrigerant.

Referring to FIG. 1, the solar battery of the present invention includes solar cell 14 having a thickness of not more than 300 μm, and an aluminum baking layer 5A of aluminum electrode 5 having a thickness of at least 30 μm. The solar cell warping ratio that is the percentage of the warp of solar cell 14 with respect to the length of one edge of the solar cell is not more than 2.5%. As to solar cells having a thickness of not more than 300 μm, the rigidity thereof is low, causing the problem of warping. If the warping ratio of the solar cell is not more than 2.5%, there will be no trouble in the screen printing of silver paste. From the standpoint of applying silver paste more evenly, the solar cell warping ratio is preferably not more than 2.0%, further preferably not more than 1.5%, and still further preferably not more than 1.0%.

EXAMPLE 1

An alkali-etched p type silicon substrate 1 of 155 mm square and 200 μm in thickness had one side surface subjected to thermal diffusion with phosphorus (P) at 900° C. to form an n type diffusion layer 2 of approximately 0.4 μm in thickness (area resistivity: 50 Ω/☐). A silicon nitride film of 60 nm in thickness was formed thereon by plasma CVD (Chemical Vapor Deposition) as antireflection coating 3. At the back side of p type silicon substrate 1, 1.9 g of commercially-available aluminum paste (produced by Murata Seisakusho Co., Ltd. ALP-1312) was applied by screen printing, dried at 150° C., and then baked at 700° C. in the air to form an aluminum electrode. The printed amount is the amount of paste required to maintain the electrical characteristics. At this stage, the thickness of the aluminum baking layer was approximately 35 μm. The degree of warping of the solar cell at this stage was measured. Then, the solar cell was cooled for 25 seconds at −30° C. in a freezer of a dry air (dew point not more than −40° C.) atmosphere, and then taken out to be placed in a dry air (dew point not more than −40° C.) atmosphere chamber of 25° C. for at least two minutes. The degree of warping thereof was measured.

The warping measurement was carried out as set forth below with reference to FIGS. 4A and 4B. The solar cell exhibiting warping was placed with the protruding portion downwards, as shown in FIG. 4A. One edge of the solar cell exhibiting warping was depressed by three fingers at either end and a middle point therebetween to measure the height S from the horizontal plane to the right opposite corner, as shown in FIG. 4B, using a laser displacement meter. Then, the solar cell was turned counterclockwise, and the next edge of the solar cell was similarly depressed by three fingers at either end and a middle point therebetween to measure the height from the horizontal plane to the right opposite corner. By repeating this procedure, warping at the four corners of the solar cell was measured. The degree of warping was the average of the four measurements at the four corners of one solar cell. The warping decrement ratio (%) was calculated from the degree of warping S1 prior to cooling and the degree of warping S3 after cooling, using equation (1) set forth below. A warping decrement ratio of 0% implies that the warping after cooling is identical to the warping prior to cooling, whereas a warping decrement ratio of 100% implies that the warping after cooling was 0.

$$\text{Warping decrement ratio (\%)}=100\times(S1-S3)/S1 \quad (1)$$

The solar cell warping ratio that is the percentage of warping of the solar cell with respect to the length of one edge of the solar cell was calculated by equation (2) set forth below. The results are summarized in Table 1.

$$\text{Solar cell warping ratio (\%)}=100\times S3/(\text{length of one edge of solar cell}) \quad (2)$$

EXAMPLES 2-5

Examples 2-5 were prepared in a manner identical to Example 1, provided that the cooling temperature in the cooling step was set as shown in Table 1. The degree of warping of respective solar cells was measured, and the warping decrement ratio and solar cell warping ratio were calculated. The results are summarized in Table 1.

TABLE 1

| | | Example 1 | Example 2 | Example 3 | Example 4 | Example 5 |
|---|---|---|---|---|---|---|
| Cooling temperature (° C.) | | −30 | −20 | −10 | 0 | 5 |
| Cooling duration (seconds) | | 25 | 25 | 25 | 25 | 25 |
| Degree of warping (mm) | Prior to cooling step | 2.9 | 2.5 | 2.7 | 3.0 | 3.0 |
| | After cooling step | 0.7 | 0.8 | 1.4 | 2.0 | 2.4 |
| Warping decrement ratio (%) | | 76 | 68 | 48 | 33 | 20 |
| Solar cell warping ratio (%) | | 0.5 | 0.5 | 0.9 | 1.3 | 1.5 |

It is apparent from Table 1 that warping of a solar cell can be reduced by providing a cooling step after the aluminum electrode formation step in the fabrication method of a solar battery. The effect of reducing warping became more significant as the cooling temperature was lower. By a cooling step carried out for 25 seconds, the warping decrement ratio was 20% at the cooling temperature of 5° C., 33% at the cooling temperature of 0° C., 48% at the cooling temperature of −10° C., 68% at the cooling temperature of −20° C., and 76% at the cooling temperature of −30° C.

Since both the cooling step and the exposure at 25° C. subsequent to the cooling step were carried out in a dry air atmosphere where the dew point was not more than −40° C., no dew condensation occurred in the solar battery, and subsequent handling was facilitated.

Following the above-described measurement of warping, a solar battery was completed in accordance with the normal processing step. No particular difference was identified in the comparison of properties with solar batteries not subjected to a cooling step. For the sake of confirming the reliability, a temperature-humidity cycle test was conducted on the solar battery. No significant difference over conventional products were identified. It was apparent that there was no problem from the perspective of reliability.

EXAMPLE 6

An alkali-etched p type silicon substrate 1 of 155 mm square and 280 μm in thickness had one side surface subjected to thermal diffusion with phosphorus (P) at 900° C. to form an n type diffusion layer 2 of approximately 0.4 μm in thickness (area resistivity: 50 Ω/□). A silicon nitride film of 60 nm in thickness was formed thereon by plasma CVD as antireflection coating 3. At the back side of p type silicon substrate 1, 1.9 g of commercially-available aluminum paste (produced by Murata Seisakusho Co., Ltd. ALP-1312) was applied by screen printing, dried at 150° C., and then baked at 700° C. in the air to form an aluminum electrode. The printed amount is the amount of paste required to maintain the electrical characteristics. At this stage, the thickness of the aluminum baking layer was approximately 35 μm. The degree of warping of the solar cell at this stage (S1) was measured. Then, the solar cell was cooled for 25 seconds, one minute, 5 minutes, 20 minutes and 80 minutes at −17° C. in a freezer of a dry air (dew point not more than −40° C.) atmosphere, and then taken out to be placed in a dry air (dew point not more than −40° C.) atmosphere chamber of 25° C. for at least two minutes. The degree of warping thereof (S3) was measured. Based on the degree of warping prior to cooling (S1) and the degree of warping after cooling (S3), the warping decrement ratio was calculated by equation (1).

COMPARISON EXAMPLE 1

A solar cell having an aluminum electrode formed was produced in a manner similar to that of Example 6. The degree of warping of this solar cell (S4) was measured. This solar cell was left in a chamber for 20 minutes and 80 minutes in a dry air (dew point not more than −40 ° C.) atmosphere of 25° C. without being subjected to a cooling step. The degree of warping thereof (S5) was measured. Inserting S4 to S1 and inserting S5 to S3 in equation (1), the warping decrement ratio when left in a chamber (not cooled) was calculated.

COMPARISON EXAMPLE 2

A solar cell having an aluminum electrode formed was produced in a manner similar to that of Example 6. The degree of warping of this solar cell (S4) was measured. This solar cell was heated for 20 minutes and 80 minutes in an oven of 120° C., and then taken out into a dry air (dew point not more than −40° C.) atmosphere chamber of 25° C. and left for at least 2 minutes. The degree of warping thereof (S6) was measured. By inserting S4 to S1 and S6 to S3 in equation (1), the warping decrement ratio when heating is applied was calculated.

The change in the warping decrement ratio in Example 6, Comparative Example 1 and Comparative Example 2 is summarized in FIG. 5. In FIG. 5, the horizontal axis represents the duration (time in minutes) of cooling, left in a chamber, or heated, whereas the vertical axis represents the warping decrement ratio (%).

It is apparent from FIG. 5 that the solar cell exhibited almost no reduction effect in warping when left in a chamber or heated, but exhibited reduction effect in warping when cooling was applied even for a short period of time. It is recognized from FIG. 5 that the effect of warping reduction of the solar cell was achieved even if the cooling time is approximately 5 seconds, and sufficient reduction effect was achieved when the cooling time is 25 seconds or more.

EXAMPLE 7

An alkali-etched p type silicon substrate 1 of 155 mm square and 280 μm in thickness had one side surface subjected to thermal diffusion with phosphorus (P) at 900° C. to form an n type diffusion layer 2 of approximately 0.4 μm in thickness (area resistivity: 50 Ω/□). A silicon nitride film of 60 nm in thickness was formed thereon by plasma CVD as antireflection coating 3. At the back side of p type silicon substrate 1, 1.9 g of commercially-available aluminum paste (produced by Murata Seisakusho Co., Ltd. ALP-1312) was applied by screen printing, dried at 150° C., and then baked at 700° C. in the air to form an aluminum electrode. The printed amount is the amount of paste required to maintain the electrical characteristics. At this stage, the thickness of the aluminum baking layer was approximately 35 μm. The degree of warping of the solar cell at this stage (S1) was measured. Then, the solar cell was cooled for 25 seconds at −17° C. in a freezer of a dry air (dew point not more than −40° C.) atmosphere, and then taken out to be placed in a dry air (dew point not more than −40° C.) atmosphere chamber of 25° C. for at least two minutes. The degree of warping thereof (S3) was measured. The warping decrement ratio and solar cell warping ratio were calculated in a manner likewise Example 1. The results are summarized in Table 2.

EXAMPLE 8

A solar cell was produced in a manner similar to that of Example 7, provided that the solar cell was cooled in the air cooler of a freezer at 7° C.-10° C. in a dry air (dew point not more than −40° C.) atmosphere in the cooling step. The solar cell warping decrement ratio and warping ratio were calculated. The results are summarized in Table 2.

EXAMPLE 9

A solar cell was produced using p type silicon substrate of 155 mm square and 200 μm in thickness. The solar cell was fabricated in a manner similar to that of Example 7, provided that cooling was conducted using a Peltier-type sheet at −15° C. in a dry air (dew point not more than −40° C.) atmosphere in the cooling step. The warping decrement ratio and warping ratio of the solar cell were calculated. The results are summarized in Table 2.

TABLE 2

| Cooling Method | | Example 7 Freezer | Example 8 Air cooler | Example 9 Peltier type sheet |
|---|---|---|---|---|
| Cooling temperature (° C.) | | −17 | 7~10 | −15 |
| Cooling duration (seconds) | | 25 | 25 | 25 |
| Degree of warping (mm) | Prior to cooling | 5.2 | 4.1 | 1.1 |
| | After cooling step | 3.9 | 3.7 | 0.9 |
| Warping decrement ratio (%) | | 25 | 10 | 18 |
| Solar cell warping ratio (%) | | 2.5 | 2.4 | 0.6 |

It is apparent from Table 2 that the warping of the solar cell can be reduced by the non-contact type cooling method using a freezer or an air cooler, or a contact type cooling method by forming contact with a Peltier type sheet.

It is also apparent from Tables 1 and 2 that a solar battery having a solar cell warping ratio of not more than 2.5% was produced, wherein the solar battery includes a solar cell having a thickness of not more than 300 μm and an aluminum baking layer 5A of aluminum electrode 5 having a thickness of at least 30 μm.

In the example embodiment presented herein, the cooling step was carried out only immediately after the aluminum electrode formation step. However, the cooling step is effective even if it is not carried immediately after the aluminum electrode formation step. Furthermore, the cooling step can be carried out several times.

In the example embodiment, warping of a solar cell is reduced by applying a cooling step after an aluminum electrode formation step in the conventional fabrication method of a solar battery. The present invention is advantageous in that the conventional material and facility may all be applied.

Thus, the example embodiment is widely applicable to a solar battery having small warping and a fabrication method thereof.

Although the example embodiment presented herein has been described and illustrated in detail, it is clearly understood that the same is by way of illustration and example only and is not to be taken by way of limitation, the spirit and scope being limited only by the terms of the appended claims.

What is claimed is:

1. A fabrication method of a solar battery, comprising
    at least forming an aluminum electrode by applying, drying and baking aluminum paste on at least a portion of a back side of a solar cell to form an aluminum electrode, and
    cooling said solar cell having an aluminum electrode for at least 5 seconds at an atmosphere temperature of not less than −30° C. and not more than 10° C., after said forming of the aluminum electrode, wherein
    said cooling is carried out in a dry atmosphere having a dew point not more than −40° C. immediately after said forming of an aluminum electrode, wherein
    warping of said solar cell generated in said forming is enlarged in said cooling so that said solar cell stores a larger restoring force than before said cooling, and the warping of said solar cell is reduced by the restoring forces being released at the completion of said cooling.

2. The fabrication method of a solar battery according to claim 1, further comprising
    placing said solar cell having an aluminum electrode in an atmosphere of at least 20° C., after said cooling.

* * * * *